United States Patent
Lyu et al.

(10) Patent No.: US 9,455,083 B2
(45) Date of Patent: Sep. 27, 2016

(54) PARTIAL DISCHARGE DETECTION DEVICE FOR TRANSFORMER, AND TRANSFORMER INCLUDING SAME

(71) Applicant: HYOSUNG CORPORATION, Seoul (KR)

(72) Inventors: Eun Tae Lyu, Changwon-si (KR); Jae Ryong Jung, Gimhae-si (KR)

(73) Assignee: HYOSUNG CORPORATION, Seoul (KR)

( * ) Notice: Subject to any disclaimer, the term of this patent is extended or adjusted under 35 U.S.C. 154(b) by 0 days.

(21) Appl. No.: 14/441,847

(22) PCT Filed: Nov. 5, 2013

(86) PCT No.: PCT/KR2013/009922
§ 371 (c)(1),
(2) Date: May 9, 2015

(87) PCT Pub. No.: WO2014/077535
PCT Pub. Date: May 22, 2014

(65) Prior Publication Data
US 2015/0287523 A1  Oct. 8, 2015

(30) Foreign Application Priority Data

Nov. 13, 2012  (KR) ........................ 10-2012-0128453

(51) Int. Cl.
| | |
|---|---|
| *H01F 38/12* | (2006.01) |
| *H01F 27/08* | (2006.01) |
| *H01F 27/10* | (2006.01) |
| *H01F 27/02* | (2006.01) |
| *G01R 31/06* | (2006.01) |
| *G01R 21/12* | (2006.01) |
| *H01F 27/36* | (2006.01) |
| *G01R 31/02* | (2006.01) |
| *G01R 31/12* | (2006.01) |

(52) U.S. Cl.
CPC ........... *H01F 27/365* (2013.01); *G01R 31/027* (2013.01); *G01R 31/1227* (2013.01)

(58) Field of Classification Search
CPC ............ H01F 27/365; G01R 31/1227; G01R 31/027; G01R 31/1272
USPC ............. 336/84 M, 55, 58, 94; 324/547, 536
See application file for complete search history.

(56) References Cited

U.S. PATENT DOCUMENTS

| | | | | |
|---|---|---|---|---|
| 3,728,619 A | * | 4/1973 | Harrold | ................... H01F 27/33 324/521 |
| 4,158,169 A | * | 6/1979 | Harrold | .................. G01R 31/02 324/535 |

(Continued)

FOREIGN PATENT DOCUMENTS

| | | |
|---|---|---|
| KR | 10-2008-0067484 A | 7/2008 |
| KR | 10-2011-0048910 A | 5/2011 |
| KR | 10-2012-0066828 A | 6/2012 |

*Primary Examiner* — Elvin G Enad
*Assistant Examiner* — Kazi Hossain
(74) *Attorney, Agent, or Firm* — Novick, Kim & Lee, PLLC; Jae Youn Kim

(57) ABSTRACT

Provided is a partial discharge detection device for a transformer, and a transformer using the same. An on-load tap changer is provided on one side of the outer casing of a transformer, and is partitioned from the inside of the outer casing by a shielding wall. A drain pipe is formed on one side of the outer surface of the outer casing. A drain valve is installed in the drain pipe. A configuration for detecting a partial discharge signal generated within the transformer is installed in the drain pipe. That is, a detector body is installed within the drain pipe and the drain valve. A connection mounting member is installed in an end portion of the drain valve. The detector body penetrates the connection mounting member. In the meantime, a portion, such as the on-load tap changer, is partitioned from the internal space of the outer casing by the shielding wall.

17 Claims, 6 Drawing Sheets

(56) References Cited

U.S. PATENT DOCUMENTS

| | | | | |
|---|---|---|---|---|
| 4,394,635 A | * | 7/1983 | Foss | H01F 27/10 174/15.1 |
| 5,075,629 A | * | 12/1991 | Umemura | G01R 31/12 324/547 |
| 7,161,873 B2 | * | 1/2007 | Kuppuswamy | G01R 31/1209 324/536 |
| 2003/0030534 A1 | * | 2/2003 | Gu | H01F 27/367 336/221 |
| 2012/0291521 A1 | * | 11/2012 | Cavallini | G01N 33/2841 73/19.1 |

* cited by examiner

PARTIAL DISCHARGE DETECTION DEVICE FOR TRANSFORMER, AND TRANSFORMER INCLUDING SAME

TECHNICAL FIELD

The present invention relates to a partial discharge detection device for a transformer and, more particularly, to a partial discharge detection device for a transformer that detects a partial discharge signal that is generated when an insulation abnormality occurs within a transformer, and a transformer including the same.

BACKGROUND ART

Transformers are used to raise or lower an AC voltage using a mutual induction principle. In line with increases in power demand, industrialization, etc., the capacities and voltages of such transformers have become large and ultra-high. These large capacity and ultra-high voltage transformers are used in, for example, large-scale industrial facilities or transformation stations. If an accident takes place in a large-capacity transformer, the ripple effect is widespread, and thus there is a need to perform insulation diagnosis for preventing an accident in a transformer.

That is, in order to secure the reliability of a transformer and stably supply electric power, an abnormality symptom which may be a clue of an accident needs to be detected in real time in the operating state of a transformer. For this purpose, a partial discharge detection device for detecting the operating state of a transformer in real time is used.

A partial discharge is generated when an insulation abnormality occurs in a transformer. A partial discharge detection device is used to detect such a partial discharge. The partial discharge detection device is installed within a power device, such as a transformer or the like, in the state of maintaining a predetermined insulation distance, and detects a partial discharge signal.

The installation form of the partial discharge detection device varies depending on the installation position thereof. In the case of a transformer, the installation position of the partial discharge detection device is located in the upper portion of the transformer or within a drain valve in the lower portion of the transformer. In the case where the partial discharge detection device is installed in the upper portion of the transformer, the partial discharge detection device can stably detect a partial discharge signal while preventing the outflow of an insulating fluid in the state of being filled with the insulating fluid. Meanwhile, in the case where the partial discharge detection device is installed within the drain valve, there is no need to form a separate window in the transformer. It is also possible to install the partial discharge detection device at each of the positions where drain valves are present.

In FIGS. 1 and 2, a partial discharge detection device according to the conventional art is schematically illustrated. First, FIG. 1 shows a state in which a partial discharge detection device 12 has been installed in a maintenance window 11 provided in the upper portion of a transformer 10. The partial discharge detection device 12 includes a signal reception unit 13 installed in the maintenance window 11 of the transformer 10. An N-type connector 14 for transferring a detected signal to the outside is employed in the partial discharge detection device 12. The N-type connector 14 is connected to a coaxial cable 15 and transfers a signal. The coaxial cable 15 is connected to a signal processing device 15' and transfers a signal to the signal processing device 15'.

Meanwhile, in FIG. 2, a state in which a detection device 12' has been installed in a drain valve 16 present on one side of the lower portion of a transformer 10 is shown. In the detection device 12', an antenna unit is installed inside or outside an insulator and detects a partial discharge signal. In this case, an N-type connector 14 for transferring a detected signal to the outside is also employed in the partial discharge detection device 12'. The N-type connector 14 is connected to a coaxial cable 15 and transfers a signal. The coaxial cable 15 is connected to a signal processing device 15' and transfer a signal to the signal processing device 15'.

However, the conventional partial discharge detection devices 12 and 12' described above attempt to improve detection characteristics only through the improvement of the shape of the antenna unit or the improvement of the attachment structure of the antenna unit. Accordingly, the conventional technologies have their limitations on detecting a partial discharge in a transformer. That is, a problem arises in that the partial discharge detection devices 12 and 12' cannot detect a partial discharge signal occurring in a partitioned portion within the transformer no matter how high the performance of the partial discharge detection devices 12 and 12' may be.

DISCLOSURE

Technical Problem

The present invention is conceived to overcome the above problems occurring in the conventional art, and an object of the present invention is to remove a shadow zone within a transformer so that a partial discharge signal generated within the transformer can be detected in a reliable manner.

Technical Solution

In order to accomplish the above-described object, in accordance with an aspect of the present invention, there is provided a partial discharge detection device for a transformer in which coils are wound around a core and installed in an internal space of an outer casing and a shielded portion partitioned from the internal space by a shielding wall is included, the partial discharge detection device including a detector body positioned to extend between an inside and outside of a communication pipe installed in the outer casing and configured to bring the internal space and the outside into communication with each other; and an antenna unit installed in the detector body, and configured to detect a partial discharge signal generated in the transformer; wherein an opening portion that is a path through which a partial discharge signal generated within the shielded portion is transferred to the internal space is formed in the shielding wall.

The opening portion may be opened toward a space present between an inner surface of the outer casing and outer surfaces of the coils or toward a space present between the inner surface of the outer casing and a magnetic shielding membrane shielding the coils.

The detector body may extend through a connection mounting member installed in the communication pipe, and the connection mounting member may include a tubular portion opened on one side and closed on the other side and a connection flange formed along an edge of the open side of the tubular portion.

The detector body may be provided with the antenna unit configured to receive radio waves, and the antenna unit may be installed within an insulator which constitutes the detector body.

The antenna unit may include a plurality of antenna units, and the antenna units may be responsible for detecting respective transformer partial discharge signals in multiple divided signal bands.

The opening portion may include a first rectangular opening adapted to extend in a horizontal direction and a second rectangular opening perpendicularly connected to an intermediate portion of the first opening, or may be a rectangular opening, extending in the horizontal direction, or a square opening.

In accordance with another aspect of the present invention, there is provided a transformer, including an outer casing configured to have an internal space filled with an insulating fluid and to define an outer appearance of the transformer; coils installed in the internal space, and wound around a core to perform voltage transformation using a mutual induction action; a shielded portion partitioned from the internal space of the outer casing by a shielding wall, and configured such that an opening portion is formed in the shielding wall so that a partial discharge signal is transferred therethrough; a communication pipe provided in the outer casing so as to bring an inside and outside of the outer casing into communication with each other; and a detector adapted to extend to an inside and outside of the communication pipe, and configured to detect a partial discharge signal that is generated in the outer casing and the shielded portion.

The opening portion may be opened toward a space present between an inner surface of the outer casing and outer surfaces of the coils or toward a space present between the inner surface of the outer casing and a magnetic shielding membrane shielding the coils.

The detector body constituting the detector may extend through a connection mounting member installed in the communication pipe, and the connection mounting member may include a tubular portion opened on one side and closed on the other side and a connection flange formed along an edge of the open side of the tubular portion.

The opening portion may include a first rectangular opening adapted to extend in a horizontal direction and a second rectangular opening perpendicularly connected to an intermediate portion of the first opening, or may be a rectangular opening, extending in the horizontal direction, or a square opening.

The size of the opening portion may be differently set depending on the frequency band of the partial discharge signal so that the size of the opening portion in a case of detecting a partial discharge signal in a low frequency region is set to a value larger than that in a case of detecting a partial discharge signal in a high frequency region.

Advantageous Effects

The partial discharge detection device for a transformer and the transformer using the same according to the present invention have the following advantageous effects.

In the present invention, the opening portion is formed in a structure which constitutes a shadow zone within a transformer so that a partial discharge signal can pass therethrough. Therefore, the partial discharge signal generated in the shadow zone can be smoothly transferred to the detection device through the opening portion. This results in the effect of increasing the detection sensitivity of the partial discharge signal.

In the present invention, the opening portion communicating with the shadow zone is formed so as to face the parallel plate structure arranged between the inner surface of the transformer and the magnetic shielding membrane. Therefore, a partial discharge signal generated in the shadow zone can be smoothly transferred to the installation position of the detection device through between the inner surface of the transformer and the magnetic shielding membrane. This results in the effect of enabling the detection of the partial discharge signal to be reliably achieved.

In the present invention, the detection device is positioned within the drain pipe which is provided in the outer casing of the transformer and which has a drain valve installed therein. The drain valve is positioned on the side of the shadow zone with respect to coils in the outer casing of the transformer. A partial discharge signal is transferred between the inner surface of the outer casing and the coils, and is propagated toward the drain valve. This results in the effect of enabling the partial discharge signal to be reliably detected.

MODE FOR INVENTION

Figure 1:
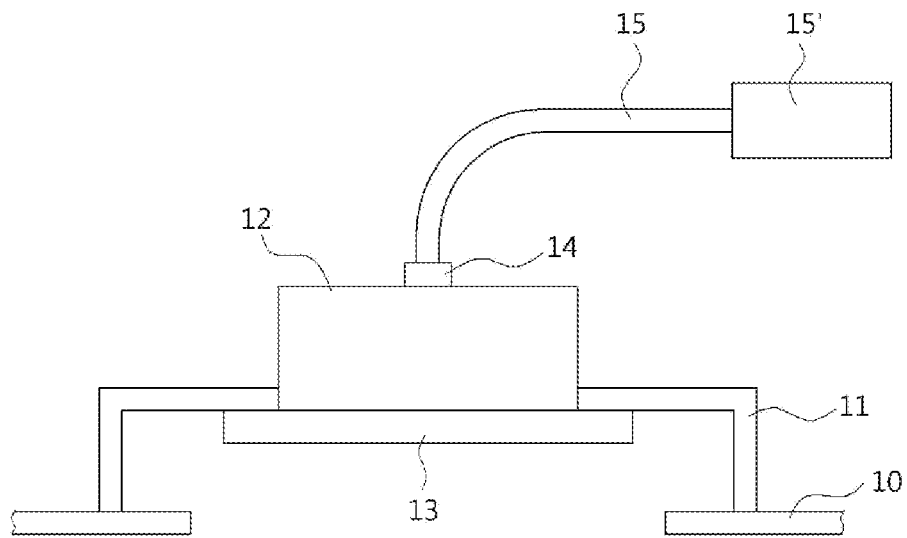
FIG. 1 is a schematic diagram illustrating a state in which a partial discharge detection device has been installed in the upper portion of a transformer.
Figure 2:
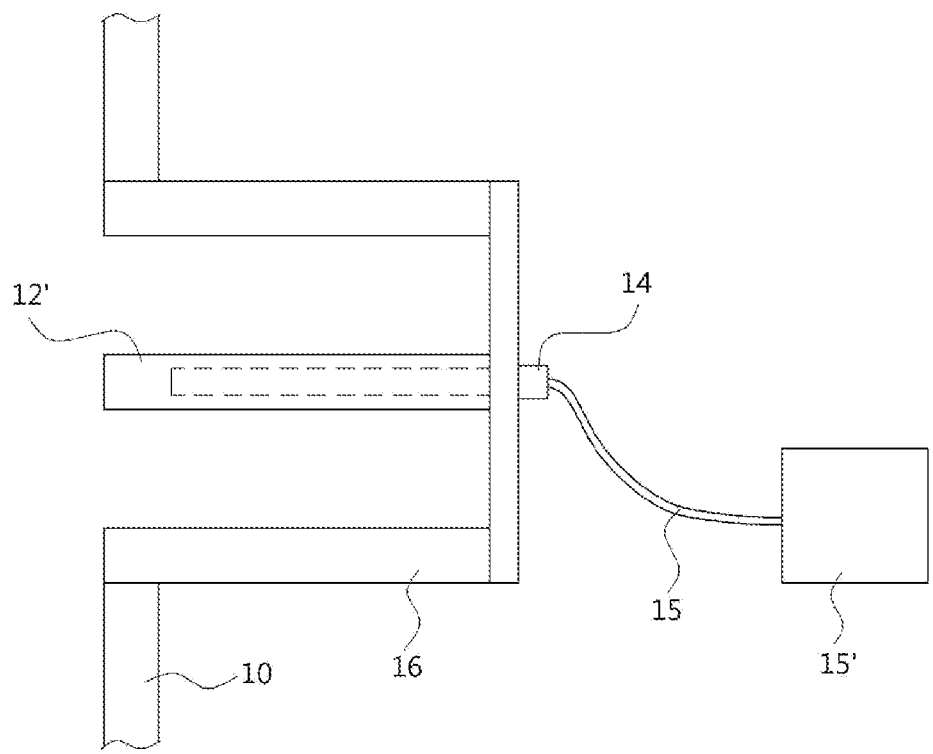
FIG. 2 is a schematic diagram illustrating a state in which a partial discharge detection device has been installed in the drain valve of a transformer.
Figure 3:
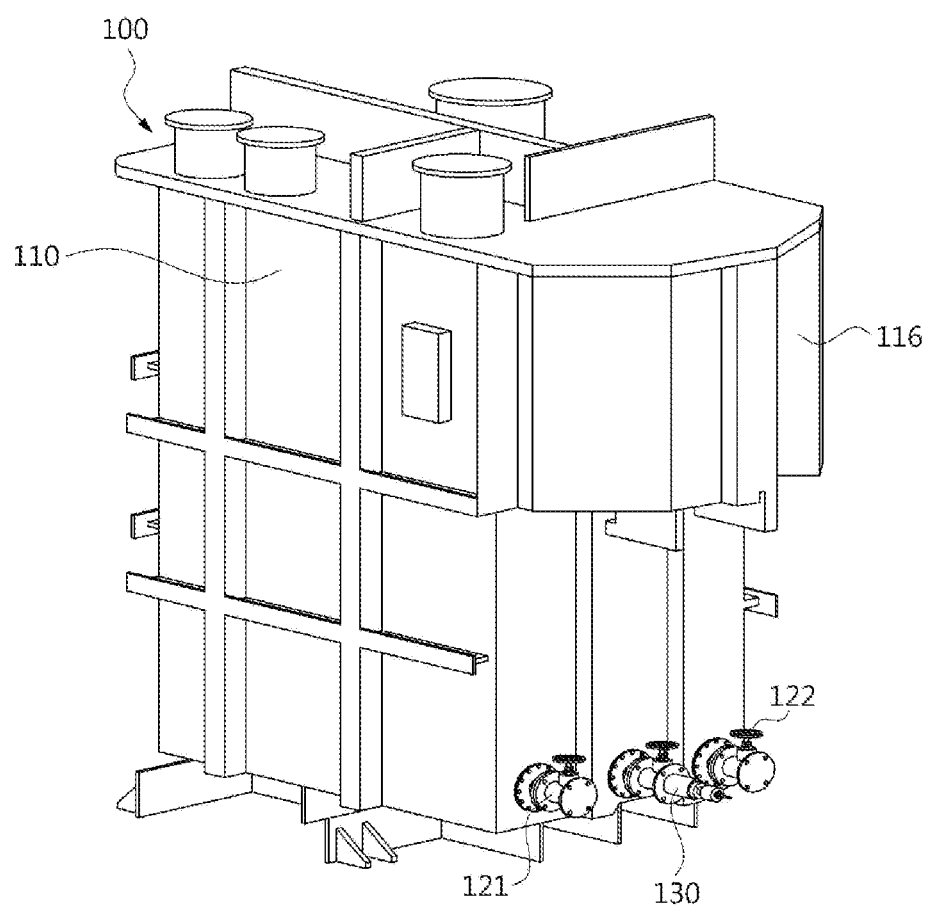
FIG. 3 is a perspective diagram illustrating the outer appearance of a transformer in which a preferred embodiment of a partial discharge detection device according to the present invention has been employed.
Figure 4:
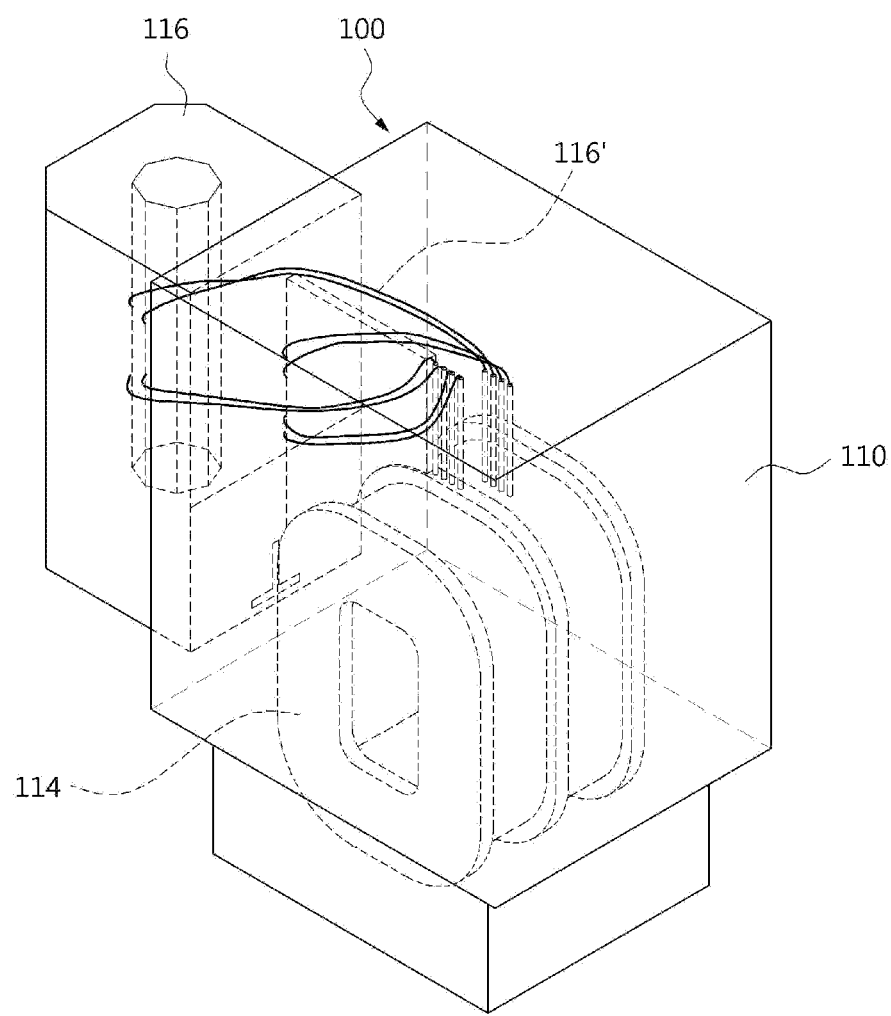
FIG. 4 is a schematic perspective diagram schematically illustrating a transformer in which a partial discharge detection device according to an embodiment of the present invention has been employed.
Figure 5:
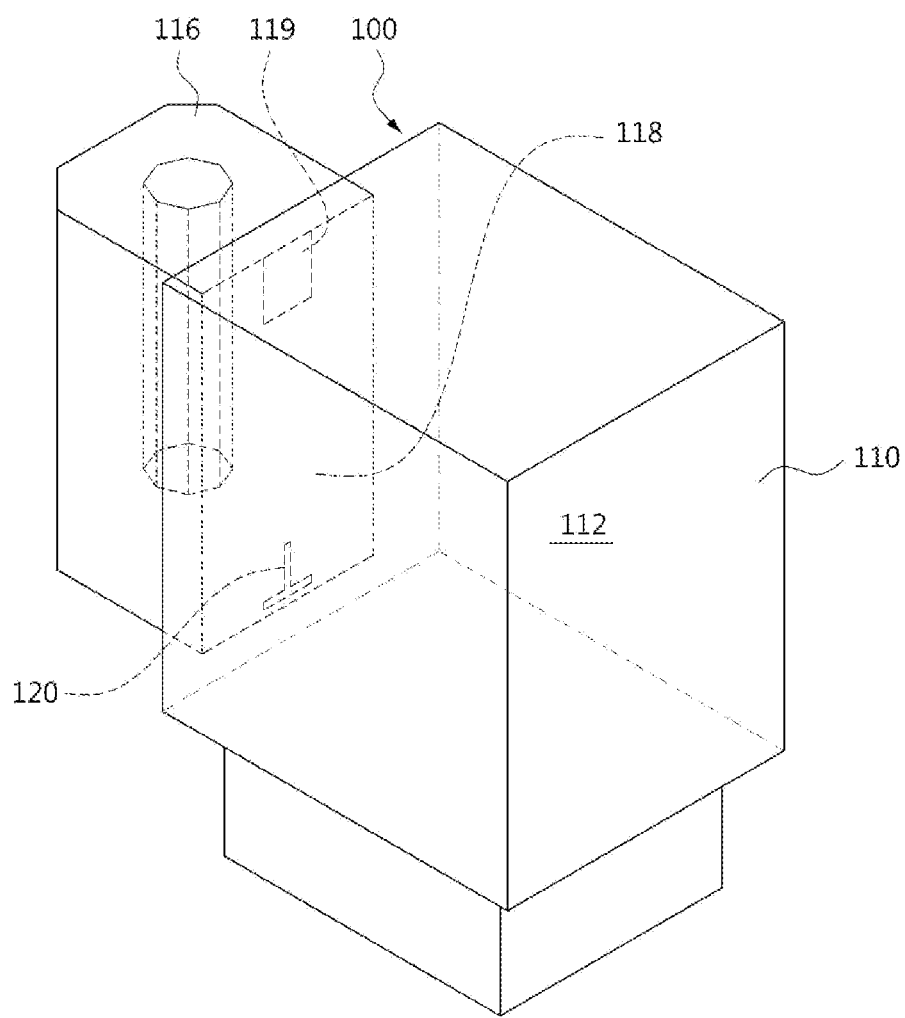
FIG. 5 is a schematic perspective diagram illustrating the outer casing and internal structure of a transformer in which a partial discharge detection device according to an embodiment of the present invention has been employed.

Hereinafter, preferred embodiments of a partial discharge detection device for a transformer according to the present invention and a transformer using the same will be described with reference to the accompanying drawings.

As illustrated in the drawings, a transformer 100 includes an outer casing 110 which defines the outer appearance of the transformer 100. The outer casing 110 is made of a metallic material, and a predetermined internal space 112 is formed inside the outer casing 110. Although the outer casing 110 has a substantially rectangular parallelepiped shape as a whole in the present embodiment, it is not limited thereto, but may be formed in many different shapes.

Coils 114 are wound around a core and installed in the internal space 112 of the outer casing 110. The internal space 112 within which the coils 114 are installed is filled with an insulating fluid (not illustrated). The configurations of the core and the like included in the internal space 112 are not illustrated for convenience of illustration.

An on-load tap changer (OLTC) 116 is installed on one side of the outer casing 110. The on-load tap changer 116 changes the voltage ratio of a transformer under a load state, and serves to adjust the voltage ratio of the primary winding of the transformer depending on fluctuations in a voltage, thereby reducing the fluctuation of a secondary voltage. A shielding wall 118 is provided between the interior of the on-load tap changer 116 and the internal space 112 of the outer casing 110, and partitions them from each other. A connection line opening 119 is formed in the shielding wall 118, and a connection line 116' which performs signal connection between the coils 114 and the on-load tap changer 116 passes through the connection line opening 119.

Figure 6:
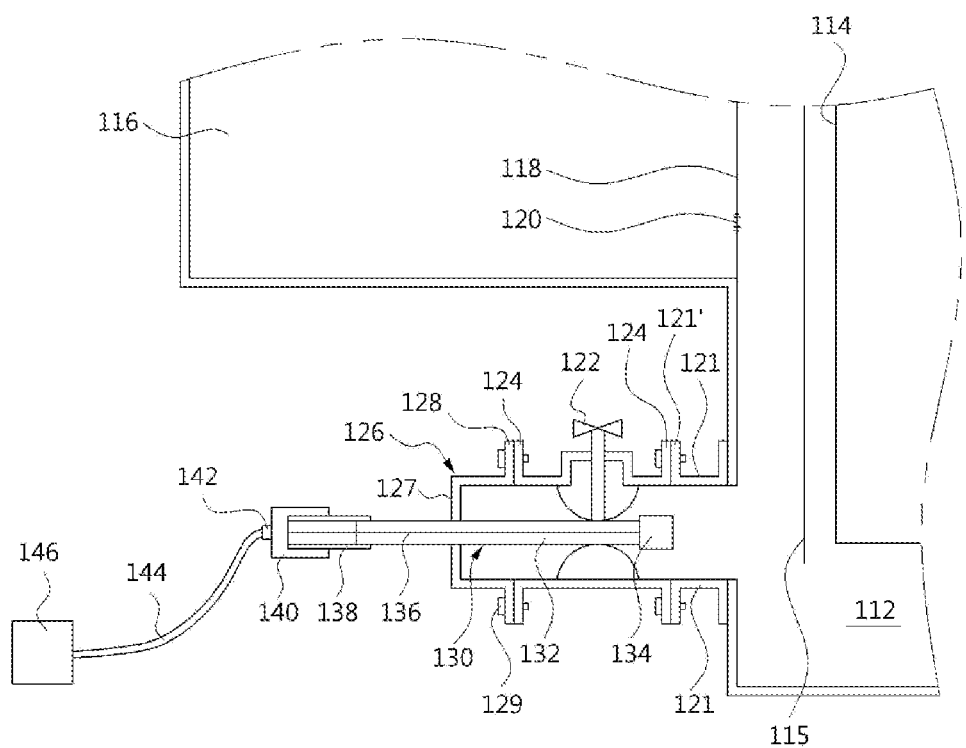
FIG. 6 is a sectional diagram illustrating the configuration of the principal parts of a transformer in which a partial discharge detection device according to an embodiment of the present invention has been employed.

Meanwhile, in the shielding wall 118, an opening portion 120 is formed below the connection line opening 119. The opening portion 120 communicates with the interior of the on-load tap changer 116 partitioned by the shielding wall 118. As illustrated in FIG. 6, the opening portion 120 is formed at a position where the opening portion 120 faces the coils 114. For reference, a magnetic shielding membrane 115 may be installed between the coils 114 and the inner surface of the outer casing 110. In the case where the magnetic shielding membrane 115 is installed, the opening portion 120 faces the magnetic shielding membrane 115. The coils 114 and the magnetic shielding membrane 115 are positioned parallel to the inner surface of the outer casing 110, thereby forming flat plate-shaped spaces between them. The flat plate-shaped spaces have such a shape that electromagnetic waves in a UHF band generated within the transformer can be well transferred. That is, the flat plate-shaped spaces serve as a type of waveguide.

Figure 7A:
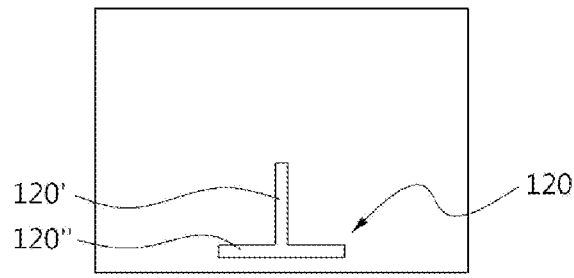
FIGS. 7(a), 7(b) and 7(c) are front views illustrating different examples of an opening portion employed in an embodiment of the present invention.

The shape of the opening portion 120 will now be described. First, in FIG. 7(a), an opening portion 120 having an inverted T shape is formed as the shape of the opening portion 120 employed in the embodiment illustrated in FIG. 6. The opening portion 120 includes a first opening 120' configured as a horizontally-extending rectangular region, and a second opening 120" perpendicularly connected to the intermediate portion of the first opening 120.' Longitudinal waves may pass through the first opening 120.' and transverse waves may pass through the second opening 120." The reason for employing this configuration is to ensure that electromagnetic waves can pass through the opening portion 120 regardless of whether the electromagnetic waves are transverse waves or longitudinal waves.

Figure 7B:
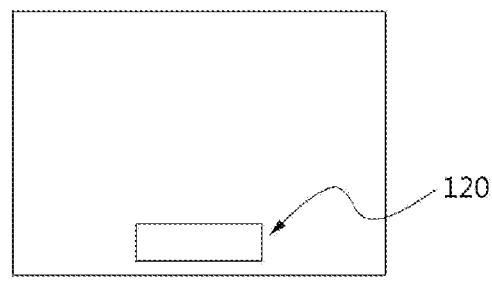

Meanwhile, in FIG. 7(b), an opening portion 120 is formed in a straight shape. This opening portion 120 may preferably be used chiefly in the case where electromagnetic waves are transverse waves.

Figure 7C:
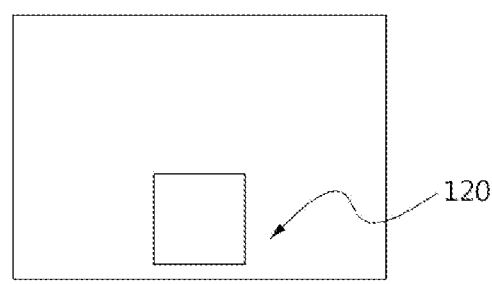

Furthermore, in FIG. 7(c), an opening portion 120 is formed in a substantially square shape. The reason for employing this configuration is to ensure that electromagnetic waves can pass through the opening portion 120 regardless of whether the electromagnetic waves are transverse waves or longitudinal waves. However, a problem arises in that the strength of the overall shielding wall 118 becomes low.

The size of the opening portion 120 varies depending on the frequency band of a partial discharge signal generated within the transformer. In general, the size of the opening portion 120 needs to be increased in order to sensitively detect a partial discharge signal in a low frequency region. In contrast, the size of the opening portion 120 needs to be decreased in order to sensitively detect a partial discharge signal in a high frequency region.

Furthermore, drain pipes 121 are provided along the outer surface of the outer casing 110, and a drain valve 122 is mounted onto each of the drain pipes 121. The drain valve 122 is configured to drain an insulating fluid to the outside of the outer casing 110 through the drain pipe 121 when required. A configuration for detecting a partial discharge signal is installed within the drain valve 122 and the drain pipe 121. A mounting flange 121' is formed at one end of the drain pipe 121 to protrude along the outer surface thereof. The mounting flange 124 of the drain valve 122 is mounted onto the mounting flange 121' of the drain pipe 121. Mounting flanges 124 are provided at the opposite ends of the drain valve 122. One of the mounting flanges 124 is fastened to the mounting flange 121' of the drain pipe 121 while the other is fastened to the connection flange 126 of a connection mounting member 126. The connection mounting member 126 is used to install a below-described detection device in the drain valve 122. That is, the connection mounting member 126 serves to prevent an insulating fluid from being drained through the drain pipe 121 even when the drain valve 122 is kept opened.

For this purpose, the connection mounting member 126 is provided with a tubular portion 127. The tubular portion 127 is formed such that the cross section thereof corresponds to the cross section of the drain valve 122. The tubular portion 127 is opened on one side and closed on the other side. The tubular portion 127 is configured such that a below-described detector body 130 penetrates the closed portion. A connection flange 128 fastened to the mounting flange 124 of the drain valve 122 is formed in an open-side edge of the tubular portion 127. The connection flange 128 is formed to have substantially the same size and shape as those of the mounting flange 124.

The drain valve 122 to which the connection mounting member 126 is mounted is provided with a configuration for detecting a partial discharge signal. First, a detector body 130 is installed in a space, in which the drain valve 122 and the connection mounting member 126 are present, so as to penetrate the connection mounting member 126. The detector body 130 includes an insulator 132 made of an insulating material. An antenna unit 134 is installed within the insulator 132. A plurality of antenna units 134 may be provided. This for this is to enable the antenna units to have different wavelengths for respective multiple divided partial discharge signal bands (e.g., four frequency bands including a first band (0.5 to 0.75 GHz), a second band (0.75 to 1.00 GHz), a third band (1.00 to 1.25 GHz) and a fourth band (1.25 to 1.5 GHz)) so that partial discharge signals in mutually different bands can be detected with high sensitivity.

The detector body 130 is installed so as to penetrate the tubular portion 127 of the connection mounting member 126. A metallic sealing portion 138 is provided in the detector body 130 extending to the outside of the connection mounting member 126. An antenna cable 136 passing through the insulator 132 is installed so as to extend through the metallic sealing portion 138.

A metal knob 140 is mounted onto and installed in an end portion of the metallic sealing portion 138. The metal knob 140 is formed so as to surround the metallic sealing portion 138. An N-type connector 142 electrically connected to the antenna cable 136 is installed in an end portion of the metal knob 140. A coaxial cable 144 is connected to the N-type connector 142. The coaxial cable 144 is connected to a signal processing device 146 so as to transfer a detected signal to the signal processing device 146.

The use of the partial discharge detection device for a transformer according to the present invention having the aforementioned configuration and the transformer using the same will now be described in detail.

During the operation of the transformer 100, a partial discharge may be generated within the outer casing 110. Upon the generation of the partial discharge, electromagnetic waves are generated and propagated. As the electromagnetic waves are transferred through the internal space 112 of the outer casing 110 and are moved toward the drain pipe 121, the electromagnetic waves are detected by the antenna unit 134.

If the partial discharge is generated within the internal space 112 where the coils 114 are present, the electromagnetic waves may be well transferred toward the drain pipe 121 in which the drain valve 122 is installed. It will be apparent that it is relatively difficult to detect the partial discharge generated in the internal space 112 on the opposite side of the coils 114 from the drain pipe 121 in which the detection device is installed. This problem may be overcome by installing a detection device in a drain pipe 121 present on the opposite side.

Meanwhile, for example, a partial discharge may be generated within the on-load tap changer 116. In this case, due to the presence of the shielding wall 118 which partitions the interior of the on-load tap changer 116 and the internal space 112 from each other, a partial discharge signal may be relatively attenuated and transferred to the internal space 112.

However, due to the presence of the opening portion 120, a partial discharge signal generated within the on-load tap changer 116 is transferred to the internal space 112 without attenuation and propagated through the space present between the magnetic shielding membrane 115 and the inner surface of the outer casing 110.

The space present between the magnetic shielding membrane 115 and the inner surface of the outer casing 110 has a flat plate shape, and serves as a type of waveguide. Accordingly, the partial discharge signal exiting from the opening portion 120 is transferred through the space present between the magnetic shielding membrane 115 and the inner surface of the outer casing 110, and is propagated toward the drain pipe 121.

Accordingly, the antenna unit 134 can easily sense the partial discharge signal. The partial discharge signal detected by the antenna unit 134 is transferred through the antenna cable 136 present within the insulator 132, and is transferred to the signal processing device 146 via the N-type connector 142 and the coaxial cable 144. The signal processing device 146 receives the partial discharge signal, and processes the signal so as to be utilized.

In the meantime, the connection mounting member 126 is used to relatively increase the length of the detector body 130, more specifically, the length of the detector body 130 inserted into the drain pipe 121 and the drain valve 122. That is, when installing the detection device in the drain pipe 121 and the drain valve 122, it is necessary to first close the drain valve 122. In this case, the detector body 130 cannot be inserted through the drain valve 122. Accordingly, the length of the detector body 130 to be inserted into the drain pipe 121 is relatively decreased.

However, when the connection mounting member 126 is mounted onto the drain valve 122, the detector body 130 passing through the connection mounting member 126 can move through the connection mounting member 126. The drain valve 122 is first closed in the state in which the tip of the detector body 130 protrudes through the connection mounting member 126 so as not to make contact with the inside of the drain valve 122. The connection mounting member 126 is mounted onto the mounting flange 124 of the drain valve 122.

After the connection mounting member 126 has been completely mounted, the drain valve 122 is opened, and the detector body 130 is pushed into the drain pipe 121 and is inserted to reach a designed position. By using the connection mounting member 126 in this way, the length of the detector body 130 inserted into the drain pipe 121 may be relatively increased.

The scope of the rights of the present invention is not limited to the above-described embodiment, but should be defined by the descriptions of the claims. It will be apparent to those skilled in the art that many different changes and modifications may be made within the scope of the rights of the present invention described in the claims.

For example, although the space shielded from the internal space 112 is the on-load tap changer 116 in the illustrated embodiment, the present invention is not necessarily limited thereto. That is, the space shielded from the internal space 112 may be any space as long as this space is shielded from the internal space 112 to some extent. The space may be, e.g., a radiator. Accordingly, this portion is referred to as a shielded portion.

Although the detection device is installed in the drain pipe 121 in which the drain valve 122 is installed in the above-described embodiment, the present invention is not necessarily limited thereto. The detection device may be installed in any communication pipe as long as this communication pipe brings the inside and the outside of the outer casing 110 into communication with each other.

The invention claimed is:

1. A partial discharge detection device for a transformer in which coils are wound around a core and installed in an internal space of an outer casing and a shielded portion partitioned from the internal space by a shielding wall is included, the partial discharge detection device comprising:
a detector body positioned to extend between an inside and outside of a communication pipe installed in the outer casing and configured to bring the internal space and the outside into communication with each other; and
an antenna unit installed in the detector body, and configured to detect a partial discharge signal generated in the transformer;
wherein an opening portion that is a path through which a partial discharge signal generated within the shielded portion is transferred to the internal space is formed in the shielding wall.

2. The partial discharge detection device of claim 1, wherein the opening portion is opened toward a space present between an inner surface of the outer casing and outer surfaces of the coils or toward a space present between the inner surface of the outer casing and a magnetic shielding membrane shielding the coils.

3. The partial discharge detection device of claim 1, wherein the detector body extends through a connection mounting member installed in the communication pipe, and the connection mounting member comprises a tubular portion opened on one side and closed on the other side and a connection flange formed along an edge of the open side of the tubular portion.

4. The partial discharge detection device of claim 3, wherein the detector body is provided with the antenna unit configured to receive radio waves, and the antenna unit is installed within an insulator which constitutes the detector body.

5. The partial discharge detection device of claim 4, wherein the antenna unit comprises a plurality of antenna units, and the antenna units are responsible for detecting respective transformer partial discharge signals in multiple divided signal bands.

6. The partial discharge detection device of claim 1, wherein the opening portion comprises a first rectangular opening adapted to extend in a horizontal direction and a second rectangular opening perpendicularly connected to an intermediate portion of the first opening, or is a rectangular opening, extending in the horizontal direction, or a square opening.

7. A transformer, comprising:
an outer casing configured to have an internal space filled with an insulating fluid and to define an outer appearance of the transformer;
coils installed in the internal space, and wound around a core to perform voltage transformation using a mutual induction action;
a shielded portion partitioned from the internal space of the outer casing by a shielding wall, and configured such that an opening portion is formed in the shielding wall so that a partial discharge signal is transferred therethrough;
a communication pipe provided in the outer casing so as to bring an inside and outside of the outer casing into communication with each other; and
a detector adapted to extend to an inside and outside of the communication pipe, and configured to detect a partial discharge signal that is generated in the outer casing and the shielded portion.

8. The transformer of claim 7, wherein the opening portion is opened toward a space present between an inner surface of the outer casing and outer surfaces of the coils or toward a space present between the inner surface of the outer casing and a magnetic shielding membrane shielding the coils.

9. The transformer of claim 7, wherein the detector body constituting the detector extends through a connection mounting member installed in the communication pipe, and the connection mounting member comprises a tubular portion opened on one side and closed on the other side and a connection flange formed along an edge of the open side of the tubular portion.

10. The transformer of claim 7, wherein the opening portion comprises a first rectangular opening adapted to extend in a horizontal direction and a second rectangular opening perpendicularly connected to an intermediate portion of the first opening, or is a rectangular opening, extending in the horizontal direction, or a square opening.

11. The transformer of claim 10, wherein the size of the opening portion is differently set depending on the frequency band of the partial discharge signal so that the size of the opening portion in a case of detecting a partial discharge signal in a low frequency region is set to a value larger than that in a case of detecting a partial discharge signal in a high frequency region.

12. The partial discharge detection device of claim 2, wherein the opening portion comprises a first rectangular opening adapted to extend in a horizontal direction and a second rectangular opening perpendicularly connected to an intermediate portion of the first opening, or is a rectangular opening, extending in the horizontal direction, or a square opening.

13. The partial discharge detection device of claim 3, wherein the opening portion comprises a first rectangular opening adapted to extend in a horizontal direction and a second rectangular opening perpendicularly connected to an intermediate portion of the first opening, or is a rectangular opening, extending in the horizontal direction, or a square opening.

14. The partial discharge detection device of claim 4, wherein the opening portion comprises a first rectangular opening adapted to extend in a horizontal direction and a second rectangular opening perpendicularly connected to an intermediate portion of the first opening, or is a rectangular opening, extending in the horizontal direction, or a square opening.

15. The partial discharge detection device of claim 5, wherein the opening portion comprises a first rectangular opening adapted to extend in a horizontal direction and a second rectangular opening perpendicularly connected to an intermediate portion of the first opening, or is a rectangular opening, extending in the horizontal direction, or a square opening.

16. The transformer of claim 8, wherein the opening portion comprises a first rectangular opening adapted to extend in a horizontal direction and a second rectangular opening perpendicularly connected to an intermediate portion of the first opening, or is a rectangular opening, extending in the horizontal direction, or a square opening.

17. The transformer of claim 9, wherein the opening portion comprises a first rectangular opening adapted to extend in a horizontal direction and a second rectangular opening perpendicularly connected to an intermediate portion of the first opening, or is a rectangular opening, extending in the horizontal direction, or a square opening.

* * * * *